United States Patent
Kang et al.

(10) Patent No.: US 10,679,919 B2
(45) Date of Patent: Jun. 9, 2020

(54) HIGH THERMAL RELEASE INTERPOSER

(71) Applicant: QUALCOMM Incorporated, San Diego, CA (US)

(72) Inventors: Kuiwon Kang, San Diego, CA (US); Zhijie Wang, San Diego, CA (US); Bohan Yan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/016,888

(22) Filed: Jun. 25, 2018

(65) Prior Publication Data

US 2019/0393120 A1 Dec. 26, 2019

(51) Int. Cl.
| | |
|---|---|
| *H01L 23/498* | (2006.01) |
| *H01L 23/00* | (2006.01) |
| *H01L 23/367* | (2006.01) |
| *H01L 23/373* | (2006.01) |

(52) U.S. Cl.
CPC ........ *H01L 23/367* (2013.01); *H01L 23/3735* (2013.01); *H01L 23/49816* (2013.01); *H01L 24/17* (2013.01); *H01L 2924/15311* (2013.01)

(58) Field of Classification Search
CPC . H01L 23/367; H01L 23/538; H01L 23/5389; H01L 24/17; H01L 23/49816; H01L 2924/15311
See application file for complete search history.

(56) References Cited

U.S. PATENT DOCUMENTS

| | | | |
|---|---|---|---|
| 2001/0020739 A1* | 9/2001 | Honda | H01L 21/4857 257/684 |
| 2015/0076670 A1* | 3/2015 | Pan | H01L 23/3737 257/659 |
| 2018/0040593 A1* | 2/2018 | Zhou | H01L 24/09 |

* cited by examiner

*Primary Examiner* — Allen L Parker
*Assistant Examiner* — Gustavo G Ramallo
(74) *Attorney, Agent, or Firm* — Patterson & Sheridan L.L.P.

(57) ABSTRACT

An integrated circuit package having an interposer with increased thermal conductivity and techniques for fabricating such an integrated circuit package are provided. One example integrated circuit package generally includes a package substrate, at least one semiconductor die disposed above the package substrate, and an interposer disposed above the at least one semiconductor die. The interposer includes a dielectric layer, and a metallic plate disposed adjacent to a first portion of the dielectric layer. The height of the metallic plate is greater than a height of the dielectric layer.

20 Claims, 16 Drawing Sheets

HIGH THERMAL RELEASE INTERPOSER

TECHNICAL FIELD

Certain aspects of the present disclosure generally relate to integrated circuits (ICs) and, more particularly, to integrated circuit packaging with one or more high thermal release interposers, e.g., for improved heat dissipation away from integrated circuits within the integrated circuit packaging.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA), for surface mounting packages to a circuit board (e.g., printed circuit board (PCB)). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

As the density of active components in integrated circuit dies continues to rise, the integrated circuit dies produce an ever-increasing amount of heat during operation. This heat is typically thermally conducted from the integrated circuit dies through multiple thermal bar vias to a heat sink to facilitate heat dissipation away from the integrated circuit dies. In some cases, heat spreaders (e.g., vapor chambers) may be used to spread heat from a concentrated heat source, such as an integrated circuit die, to a larger heat sink.

SUMMARY

Certain aspects of the present disclosure generally relate to integrated circuit packaging that includes an interposer structure that allows for improved heat management (e.g., greater heat dissipation away from integrated circuit dies) within the integrated circuit packaging.

Certain aspects of the present disclosure are directed to an integrated circuit package. The integrated circuit package includes a package substrate, at least one semiconductor die disposed above the package substrate, and an interposer disposed above the at least one semiconductor die. The interposer includes a dielectric layer and a metallic plate disposed adjacent to a first portion of the dielectric layer. A height of the metallic plate is greater than a height of the dielectric layer.

Certain aspects of the present disclosure are directed to a method for fabricating an integrated circuit package. The method includes forming a package substrate, forming at least one semiconductor die above the package substrate, and forming an interposer above the at least one semiconductor die. Forming the interposer includes forming a dielectric layer and forming a metallic plate adjacent to a first portion of the dielectric layer, wherein a height of the metallic plate is greater than a height of the dielectric layer.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
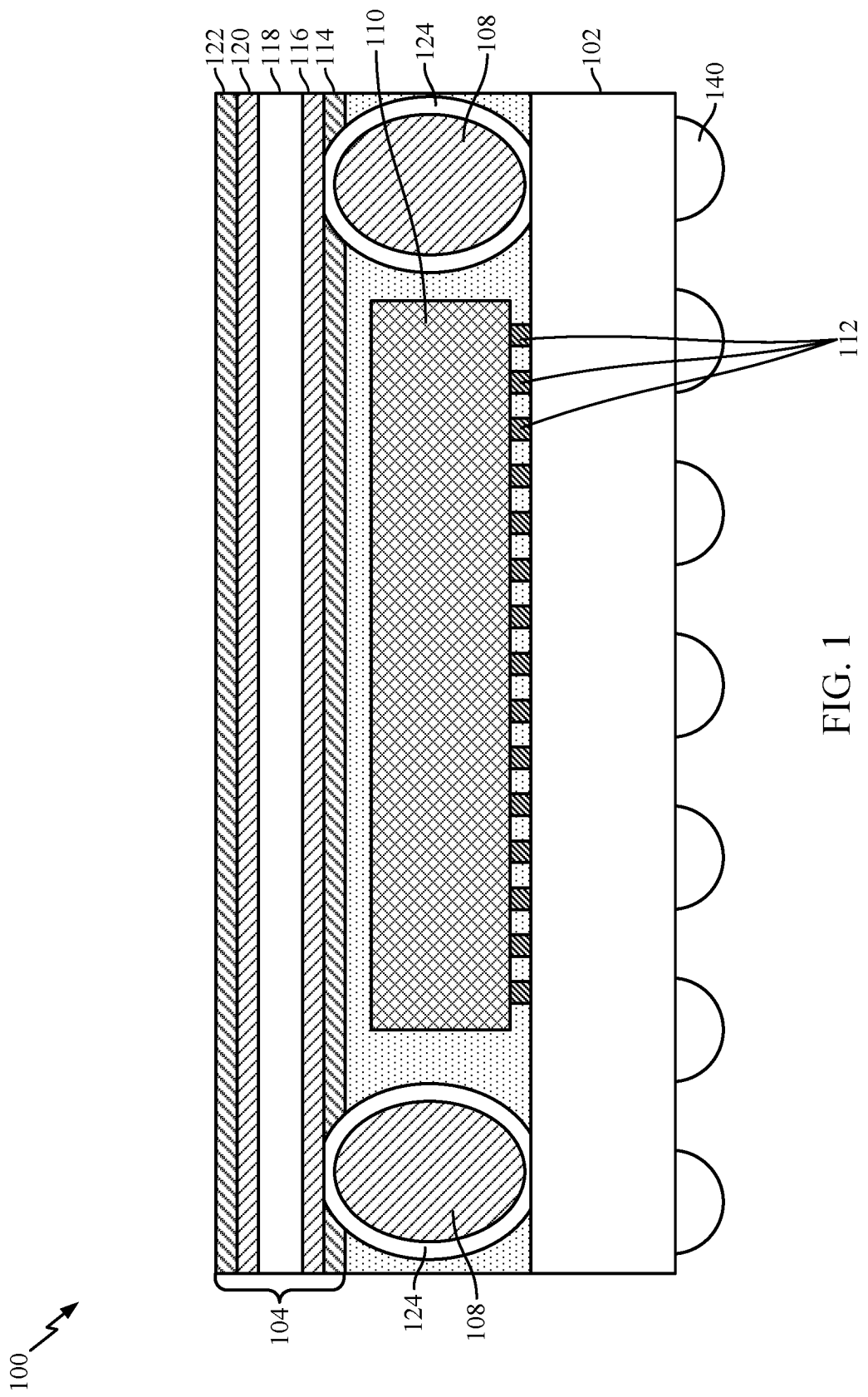
FIG. 1 illustrates a cross-sectional view of an example integrated circuit (IC) package.

Aspects of the present disclosure provide structures for high thermal release interposers suitable for integrated circuit (IC) packaging. More specifically, aspects presented herein provide various IC packages that include one or more semiconductor dies and an interposer disposed above the semiconductor die(s). The interposer may include a dielectric (or insulation) layer and a metallic plate disposed adjacent to the dielectric layer, where the height of the metallic plate is greater than the height of the dielectric layer. By placing such an interposer structure within IC packaging, aspects can substantially improve the thermal efficiency (e.g., provide greater heat dissipation) within the IC packaging, as compared to IC packaging having interposers without the metallic plate.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim. In addition, like reference numerals may be used to denote like features throughout the specification and figures.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

FIG. 1 illustrates a cross-sectional view of an example IC package 100. The IC package 100 includes a package substrate 102, an IC die 110 (also referred to as a "chip" or semiconductor die) connected to the package substrate 102, and an interposer 104 (also referred to as an interposer substrate). In some cases, the package substrate 102 may be a multi-layered substrate. Although a single IC die 110 is shown in FIG. 1, the IC package 100 may include multiple IC dies connected to the package substrate 102. The package substrate 102 may be mounted and connected to a printed circuit board (PCB) (not shown), utilizing metallic (e.g., copper (Cu)) core balls 140, a set of solder balls (e.g., in a ball grid array (BGA)), wire bonding, or any other suitable technique. The package substrate 102 may include silicon (Si), for example.

The IC die 110 may be a programmable logic device (e.g., field programmable gate array (FPGA)), memory device, optical device, processor, or other IC structure. Optical devices include photodetectors, lasers, optical sources, and the like. In this example, the IC die 110 is mounted to the top surface of the package substrate 102 via multiple microbumps 112. The microbumps 112 electrically connect the circuitry of the IC die 110 to the package substrate 102, e.g., to enable communication of the IC die 110 with the PCB (not shown).

The interposer 104 may include circuitry for electrically connecting one or more additional IC dies (e.g., mounted above the interposer 104 via microbumps) (not shown) to the package substrate 102. The additional IC die(s) may include one or more of programmable logic devices, memory devices, optical devices, etc. In some cases, the interposer 104 may also include circuitry for interconnecting IC die(s) so that the IC die(s) may communicate with each other (e.g., in a horizontal configuration rather than vertical). As shown, the interposer 104 includes a dielectric layer (or insulation layer) 118, a metallic layer 116 disposed below the dielectric layer 118, a metallic layer 120 disposed above the dielectric layer 118, a photo solder resist layer 114 disposed below the metallic layer 116, and a photo solder resist layer 122 disposed above the metallic layer 120. The dielectric layer 118 may include any of various suitable dielectric materials, such as silicon dioxide ($SiO_2$).

In some examples, the interposer 104 may be passive and include interconnects (not shown) and/or through-silicon vias (TSVs) (not shown) for connecting one of the IC die(s) to another and/or for connecting the additional IC die(s) above the interposer to the IC die(s) beneath. In some examples, the interposer 104 may be active and include transistors. Metallic (e.g., Cu) core balls 108 or a set of solder balls may be utilized to provide an electrical connection between the circuitry of the interposer 104 and the circuitry of the package substrate 102. Each of the metallic core balls 108 may be enclosed within a thin other metallic (e.g., tin (Sn)) layer 124. While two metallic core balls 108 are shown in FIG. 1, the IC package 100 may include any number (e.g., greater than two) of metallic core balls 108 disposed between the interposer 104 and the package substrate 102.

As the density of active components in IC die(s) continues to rise, the IC dies may produce an ever-increasing amount of heat during operation. This increased heat can reduce the thermal efficiency, and in turn, the performance of the IC package. In some cases, the interposer of an IC package may facilitate heat dissipation within the IC package. However, conventional interposers, such as the interposer 104 within IC package 100, generally do not have a structure that allows for efficient thermal heat spreading and low thermal resistance. For example, techniques that use TSV(s) within the interposer (e.g., interposer 104) to release heat are typically inefficient and cost-intensive.

Certain aspects of the present disclosure provide various structures for interposers that allow for improved heat management within IC packages. For example, as described in more detail below, the IC package may include an interposer that is disposed above at least one IC die. The interposer may include a dielectric layer, and a metallic plate that is disposed adjacent to the dielectric layer. The height of the metallic plate may be greater than a height of the dielectric layer. By including such an interposer structure within an IC package, the interposer can substantially increase heat dissipation away from the at least one IC die of the IC package (e.g., relative to conventional interposers, such as interposer 104).

Figure 2:
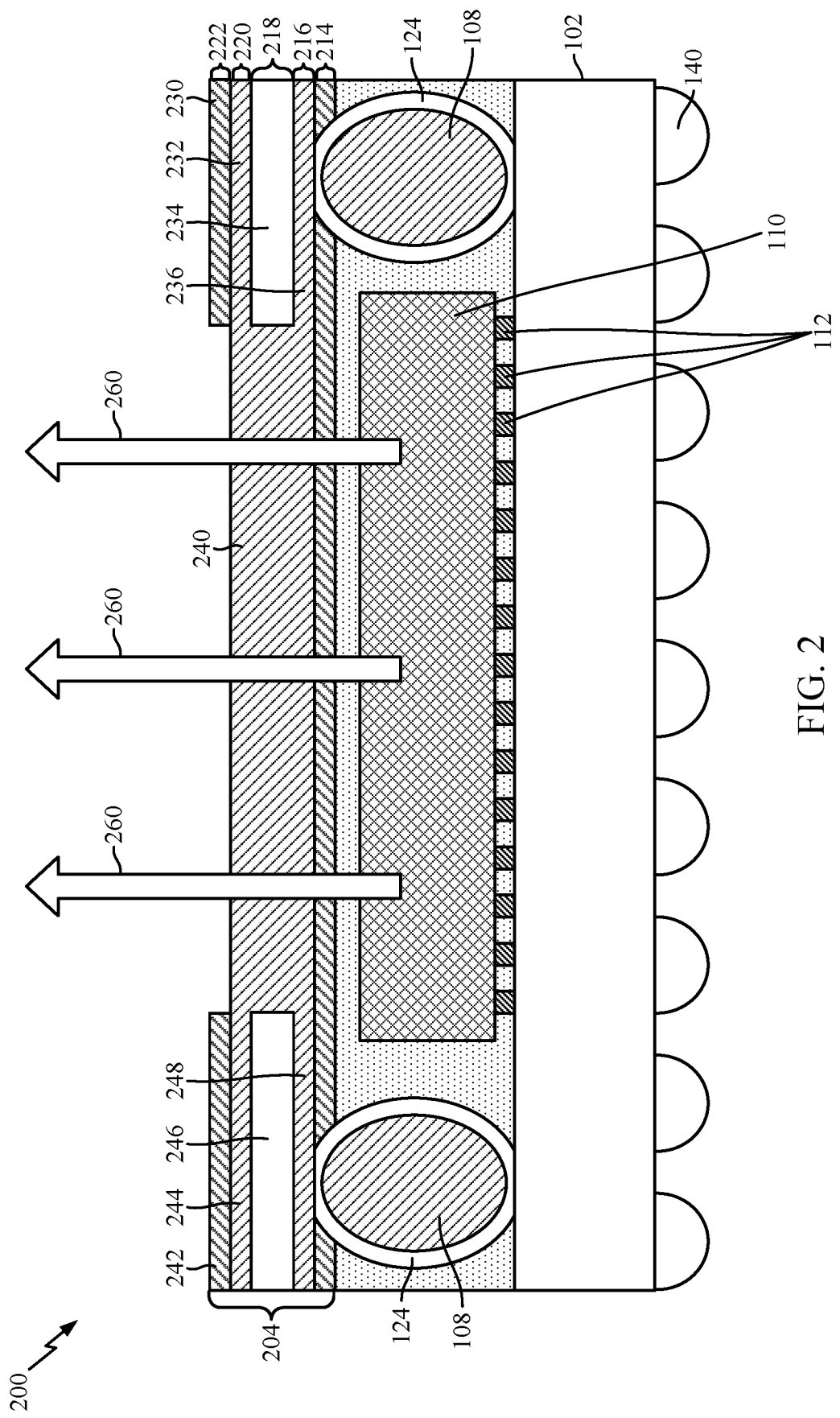
FIG. 2 illustrates a cross-sectional view of an example IC package having a high thermal release interposer, in accordance with certain aspects of the present disclosure.

FIG. 2 illustrates a cross-sectional view of an example IC package 200 that includes a high thermal release interposer, in accordance with certain aspects of the present disclosure. The IC package 200 includes a package substrate 102, an IC die 110 connected to the package substrate 102, and an interposer 204. Although a single IC die 110 is shown in FIG. 1, the IC package 200 may include multiple IC dies connected to the package substrate 102.

The interposer 204 may include circuitry for electrically connecting one or more additional IC dies (e.g., mounted above or on the interposer 204 via microbumps) (not shown) to the package substrate 102. As shown, the interposer 204 includes a dielectric layer 218, a metallic layer 220 disposed above the dielectric layer 218, a metallic layer 216 disposed below the dielectric layer 218, a photo solder resist layer 214 disposed below the metallic layer 216, and a photo solder resist layer 222 disposed above the metallic layer 220. The dielectric layer 218 may include $SiO_2$, for example. The metallic layers 216 and 220 may include Cu, for example.

The interposer 204 further includes a metallic (e.g., Cu) plate 240 disposed above the IC die 110 and on photo solder resist layer 214. The metallic plate 240 is exposed at an upper surface of the interposer 204. In some aspects, the metallic plate 240 may be further disposed adjacent to at least one portion of each of the dielectric layer 218, metallic layer 220, metallic layer 216, and photo solder resist layer 222. In this particular example, the metallic plate 240 is disposed between a portion 246 of the dielectric layer 218 and a portion 234 of the dielectric layer 218, between a portion 244 of the metallic layer 220 and a portion 232 of the metallic layer 220, between a portion 248 of the metallic layer 216 and a portion 236 of the metallic layer 216, and between a portion 242 of the photo solder resist layer 222 and a portion 230 of the photo solder resist layer 222. By placing the metallic plate 240 of the interposer 204 over at least a portion of the IC die 110, the interposer 204 can increase the thermal dissipation away from the IC die 110 (e.g., as illustrated by arrows 260). Although the metallic plate 240 is centered above the IC die 110 and covers a majority of the IC die in FIG. 2, the metallic plate may be skewed with respect to the center of the IC die, cover the entire IC die, extend beyond the IC die, and/or cover less than the majority of the IC die in other aspects.

As shown, a height (or thickness) of the metallic plate 240 is greater than a height (or thickness) of the dielectric layer 218. In some aspects, as shown, the height of the metallic plate 240 may be approximately equal to a sum of the heights of the dielectric layer 218, the metallic layer 220, and the metallic layer 216. The photo solder resist layer 222 may not cover the metallic plate 240, as shown in FIG. 2, for increased heat conduction to the ambient environment. Note that while FIG. 2 depicts the metallic plate 240 being disposed between portions 246 and 234 of the dielectric layer 218, between portions 244 and 232 of the metallic layer 220, between portions 248 and 236 of the metallic layer 216, and between portions 242 and 230 of the photo solder resist layer 222, in some aspects, the metallic plate 240 may be disposed adjacent to a single portion of each of the dielectric layer 218, metallic layer 220, metallic layer 216, and photo solder resist layer 222. For example, the metallic plate 240 may be disposed on one side of the interposer 204.

Figure 3:
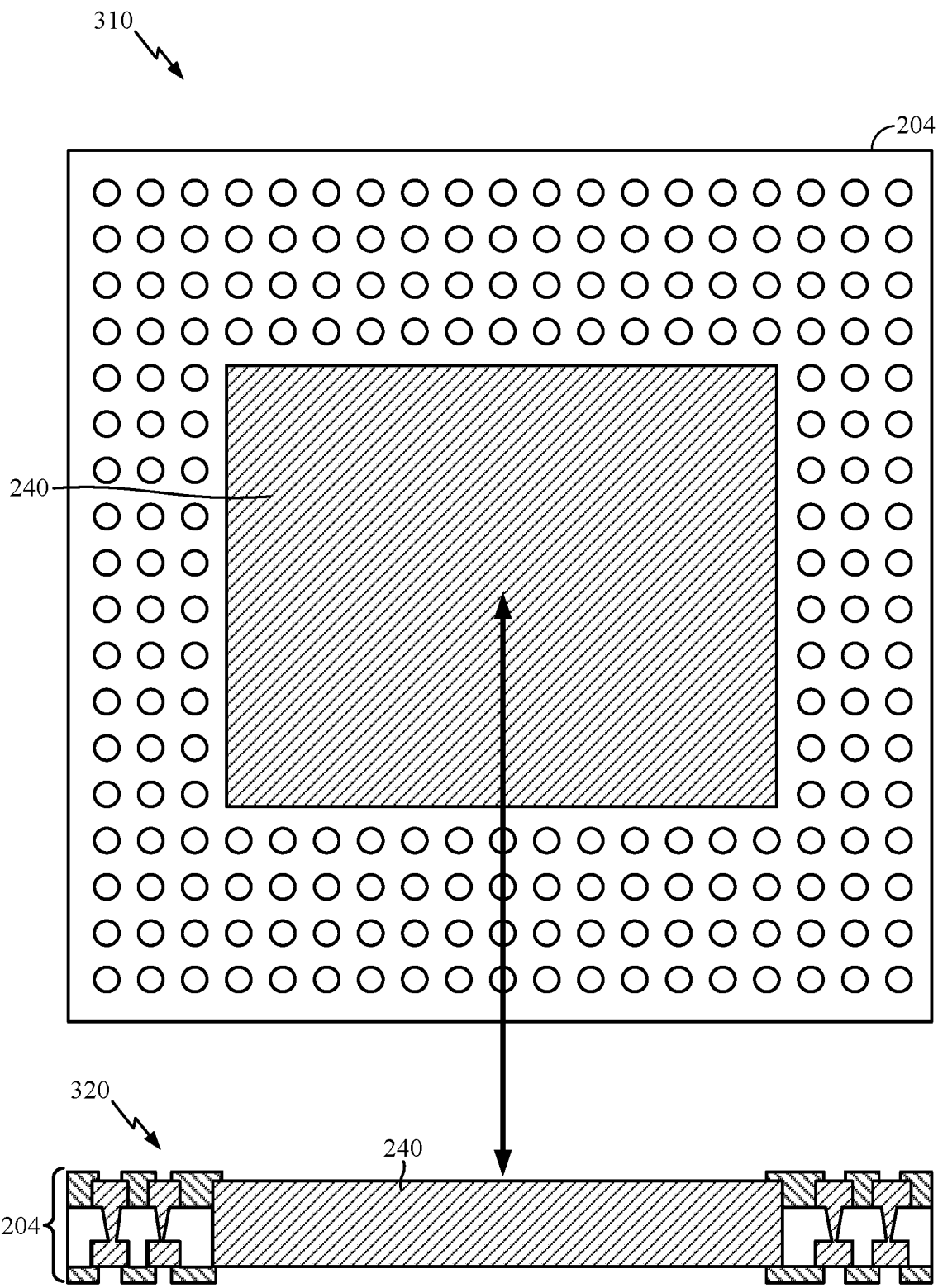
FIG. 3 illustrates a top view and a cross-sectional view of an example high thermal release interposer, in accordance with certain aspects of the present disclosure.

FIG. 3 illustrates a top view 310 and a cross-sectional view 320 of the interposer 204 of the IC package 200, in accordance with certain aspects of the present disclosure. As shown in the cross-sectional view 320, the metallic plate 240 may be a full metallic plate (e.g., including metal, such as Cu, throughout an entire thickness of the metallic plate). Additionally, in some aspects, the photo solder resist layer 222 may be patterned to expose the top surface of the metallic plate 240 for thermal coupling with IC die(s) disposed above the top surface and/or the photo solder resist layer 214 may be patterned to expose the bottom surface of the metallic plate 240 for thermal coupling with IC die(s) disposed below the bottom surface. For example, as shown in cross-sectional view 320 of FIG. 3, the top surface and bottom surface of the metallic plate 240 are exposed.

Figure 4:
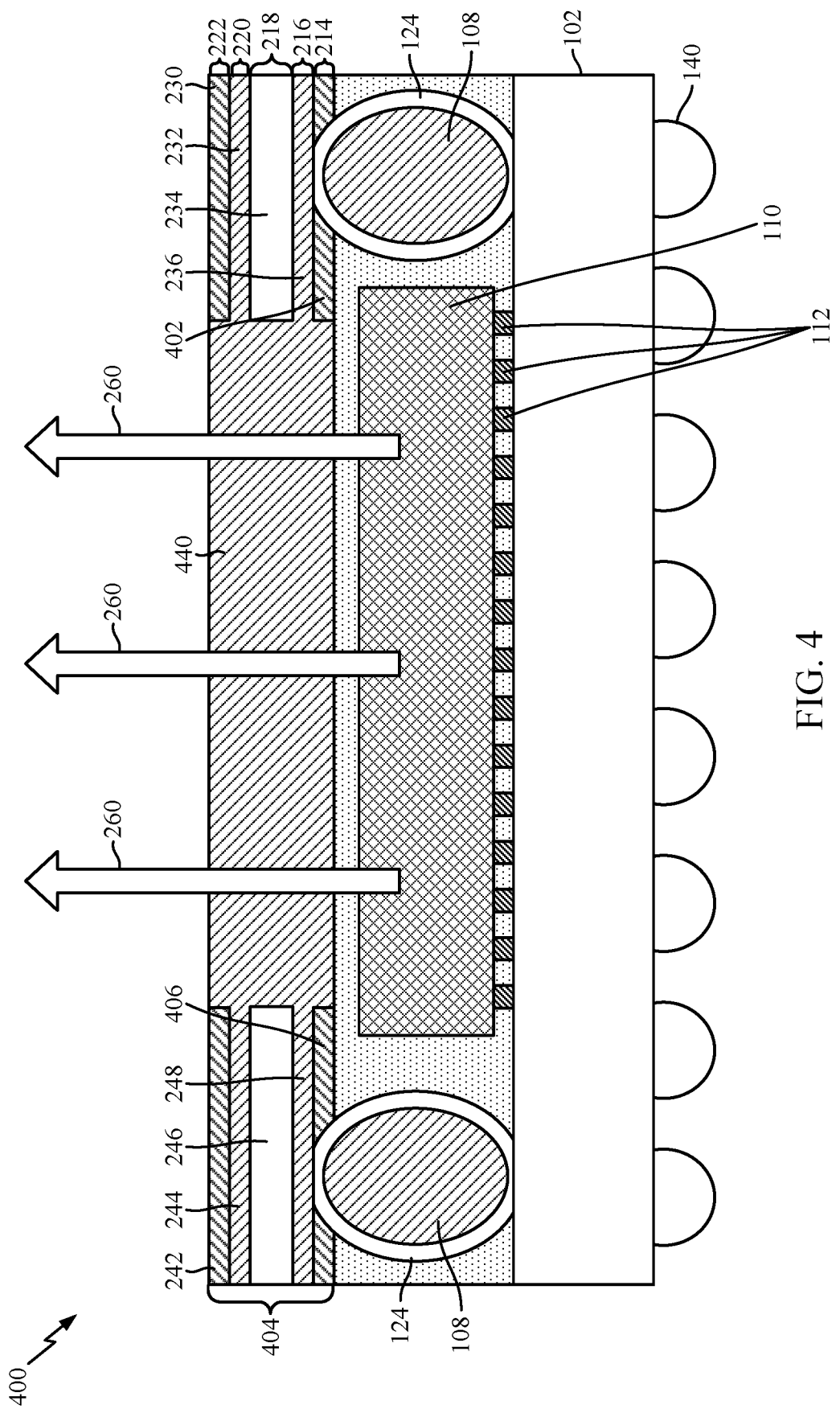
FIG. 4 illustrates a cross-sectional view of another example IC package having a high thermal release interposer, in accordance with certain aspects of the present disclosure.

FIG. 4 illustrates a cross-sectional view of an example IC package 400 that includes a high thermal release interposer, in accordance with certain aspects of the present disclosure. The IC package 400 is similar to the IC package 200, but the IC package 400 includes an interposer 404 with a metallic (e.g., Cu) plate 440 that is disposed above the IC die 110, between portions 246 and 234 of the dielectric layer 218, between portions 244 and 232 of the metallic layer 220, between portions 248 and 236 of the metallic layer 216, between portions 242 and 230 of the photo solder resist layer 222, and between portions 406 and 402 of the photo solder resist layer 214. Additionally, the interposer 404 of the IC package 400 is exposed at both a top surface and a bottom surface of the interposer 404 (e.g., for thermal coupling with IC die(s) 110 and/or IC die(s) disposed above interposer 404 (not shown)). The height of the interposer 404 may be approximately equal to a sum of heights of the dielectric layer 218, the metallic layer 216, the metallic layer 220, the photo solder resist layer 214, and the photo solder resist layer 222. By increasing the height of the interposer 404 (e.g., compared to the height of the interposer 204) such that the bottom surface of the interposer 404 is exposed to the IC die(s) 110, the interposer 404 may further increase the heat dissipation away from the IC die(s) 110 within the IC package 400.

Figure 5:
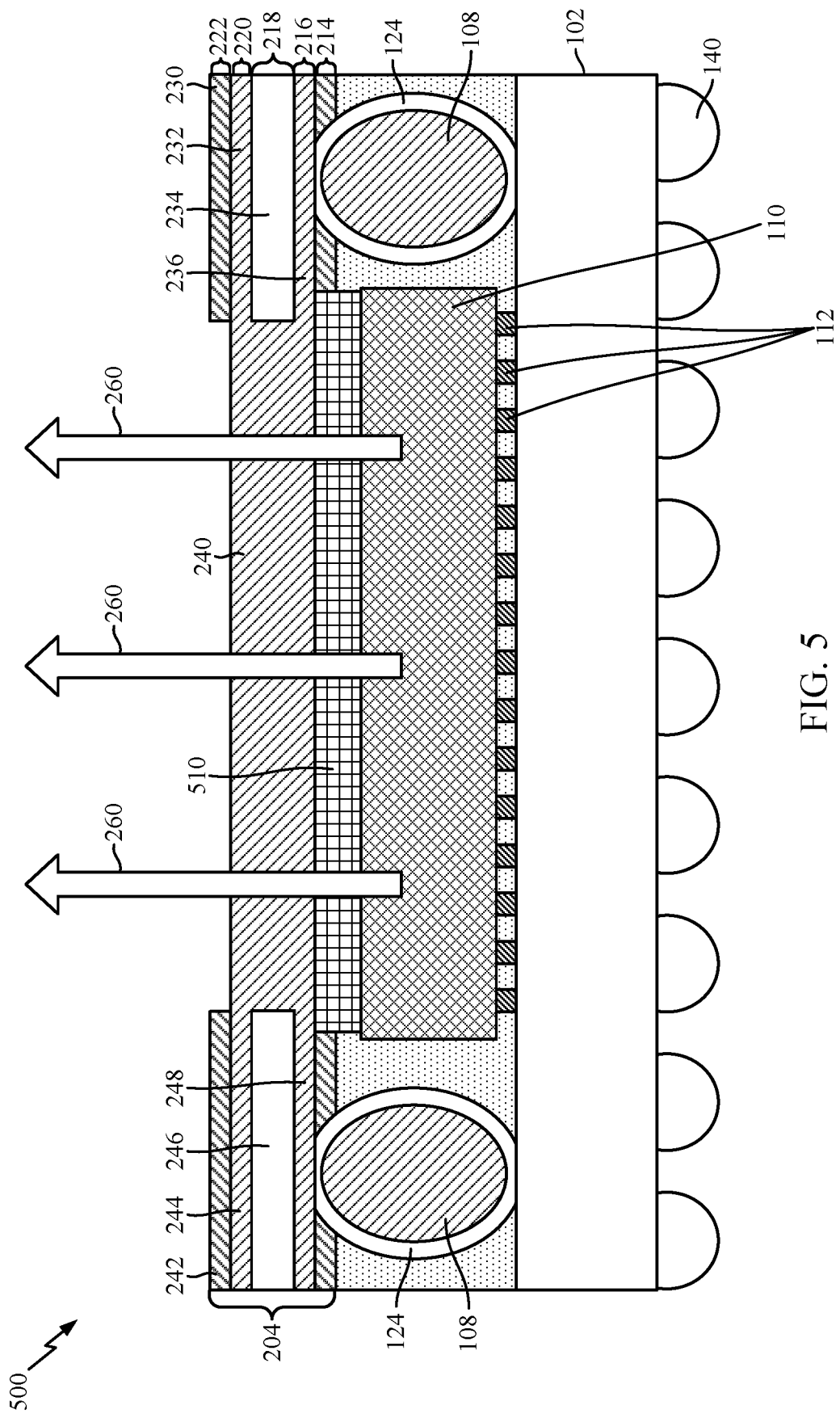
FIG. 5 illustrates a cross-sectional view of yet another example IC package having a high thermal release interposer, in accordance with certain aspects of the present disclosure.

FIG. 5 illustrates a cross-sectional view of an example IC package 500 that includes a high thermal release interposer, in accordance with certain aspects of the present disclosure. The IC package 500 is similar to the IC package 200, but the IC package 500 further includes a thermal interface material (TIM) layer 510 disposed between the interposer 204 and the IC die 110. As shown in this particular example, the TIM layer 510 is disposed between the metallic plate 240 of the interposer 204 and the IC die 110.

The TIM layer 510 may be used to provide a thermally conductive path between the interposer 204 and the IC die 110. Example of materials suitable for use as the TIM layer 510 include adhesives, thermal grease, thermally conductive epoxy, phase-change materials (PCMs), conductive tapes, and silicone-coated fabrics among other suitable materials. The TIM layer 510 may be a soft or compliant adhesive to allow compensation between mismatched heights of neighboring IC die(s) 110 within the IC package 500. In one example, the TIM layer 510 may be a thermal gel or thermal epoxy. Utilizing a metallic plate 240 within the interposer 204 in addition to a TIM layer 510 disposed between the interposer 204 and IC die(s) 110 of the IC package 500 can further increase (e.g., relative to IC packages 200 and 400) the amount of heat dissipation within the IC package 500. The increased heat dissipation, in turn, can increase the thermal performance of the IC package 500. Note, that while FIG. 5 depicts a TIM layer 510 disposed between the interposer 204 and the IC die(s) 110, in some aspects, a TIM layer 510 may be disposed between the interposer 404 and the IC die(s) 110 of FIG. 4.

FIGS. 6A-6H illustrate example processes for fabricating the high thermal release interposer 204 within the IC package 200 of FIG. 2, in accordance with certain aspects of the present disclosure. Although these processes are illustrated and described herein for interposer 204, the reader will understand that similar processes may be followed for fabricating any of the interposers (e.g., interposer 404) described herein by making appropriate adjustments and/or substitution of materials thereto.

Figure 6A:
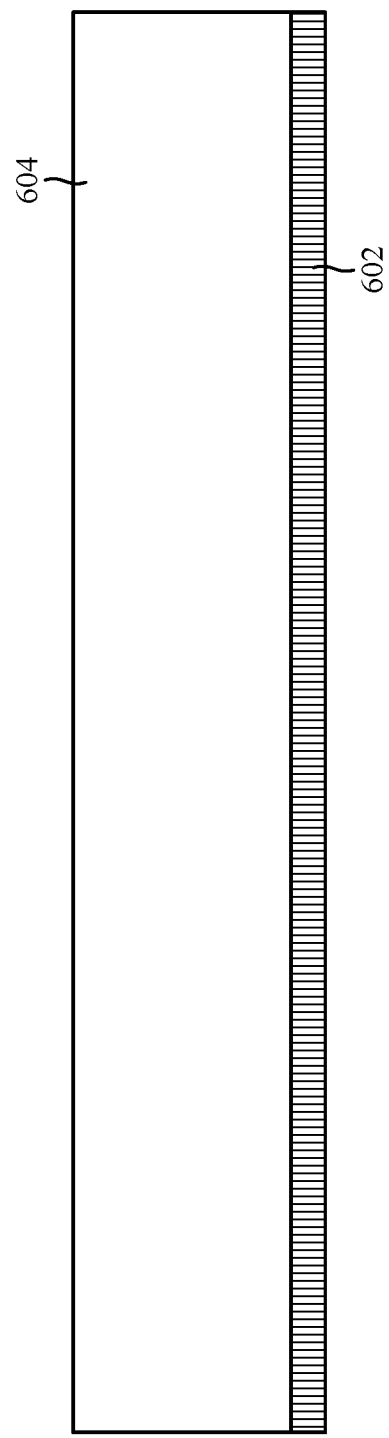
FIGS. 6A-6H illustrate example processes to fabricate a high thermal release interposer, in accordance with certain aspects of the present disclosure.
Figure 6B:
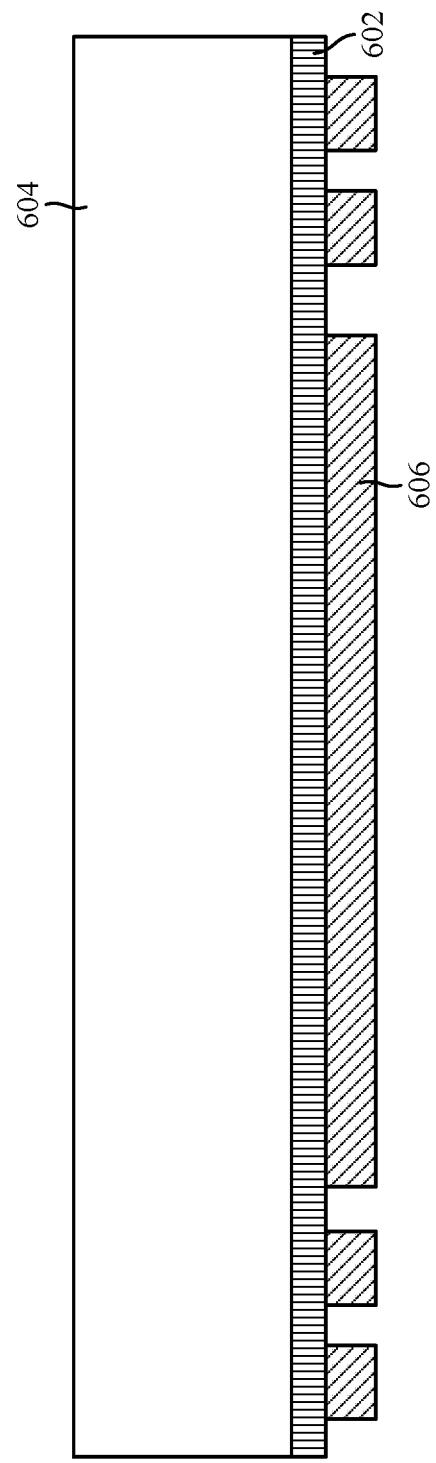
Figure 6C:
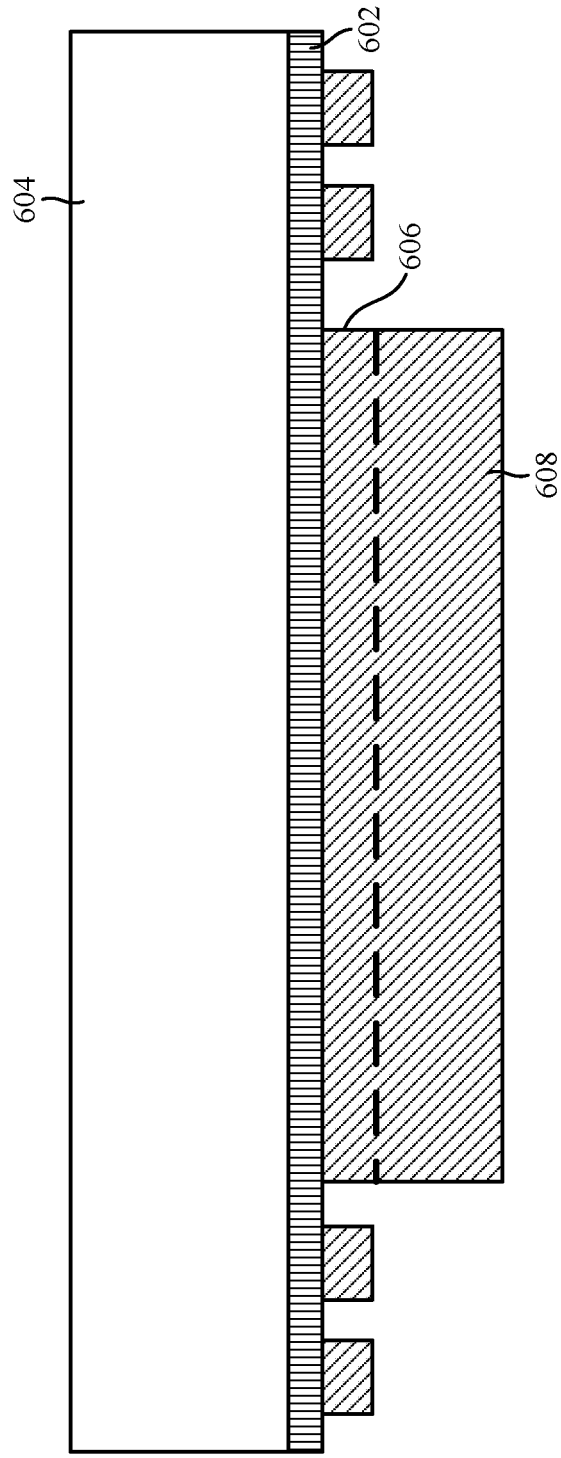

As illustrated in FIG. 6A, a substrate 604 may be formed, and a chip carrier 602 (e.g., Detach Carrier Foil (DCF)) may be formed over the substrate 604. As illustrated in FIG. 6B, a metallic (e.g., Cu) layer 606 may be formed over the chip carrier 602, and subsequently patterned. As illustrated in FIG. 6C, a metallic (e.g., Cu) plate 608 may be formed over a portion of the metallic layer 606. In some aspects, the metallic plate 608 may be formed over the portion of the metallic layer 606 that overlaps at least a portion of the IC die(s) 110.

Figure 6D:
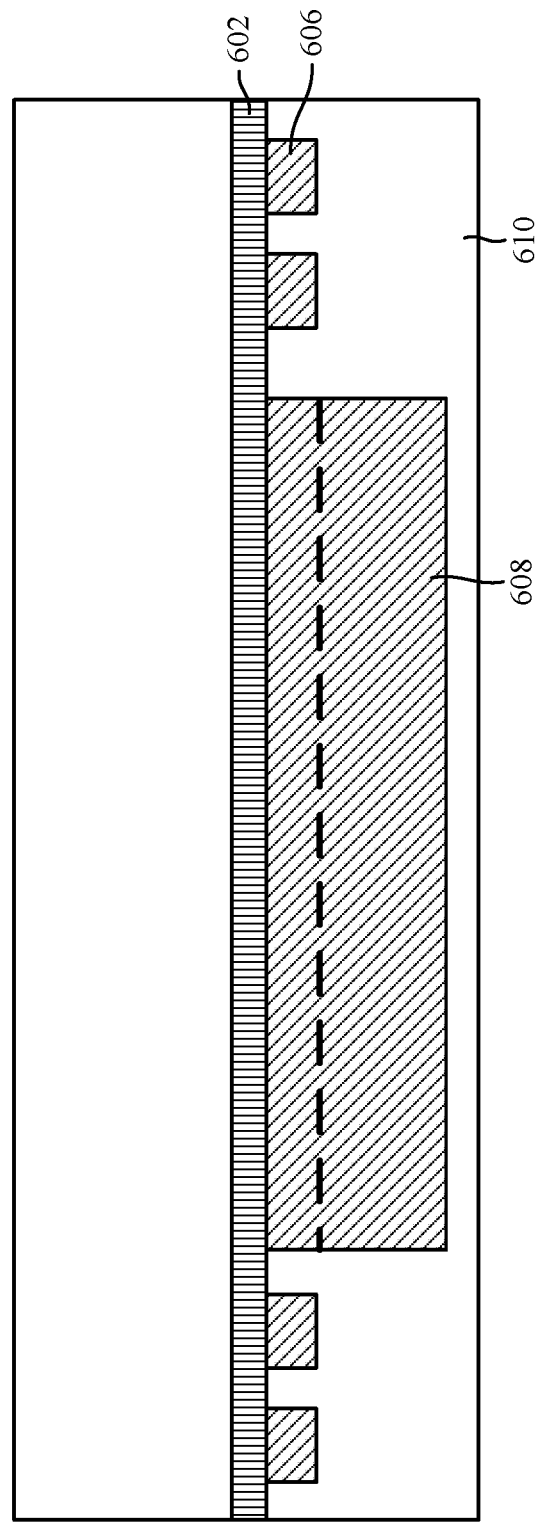
Figure 6E:
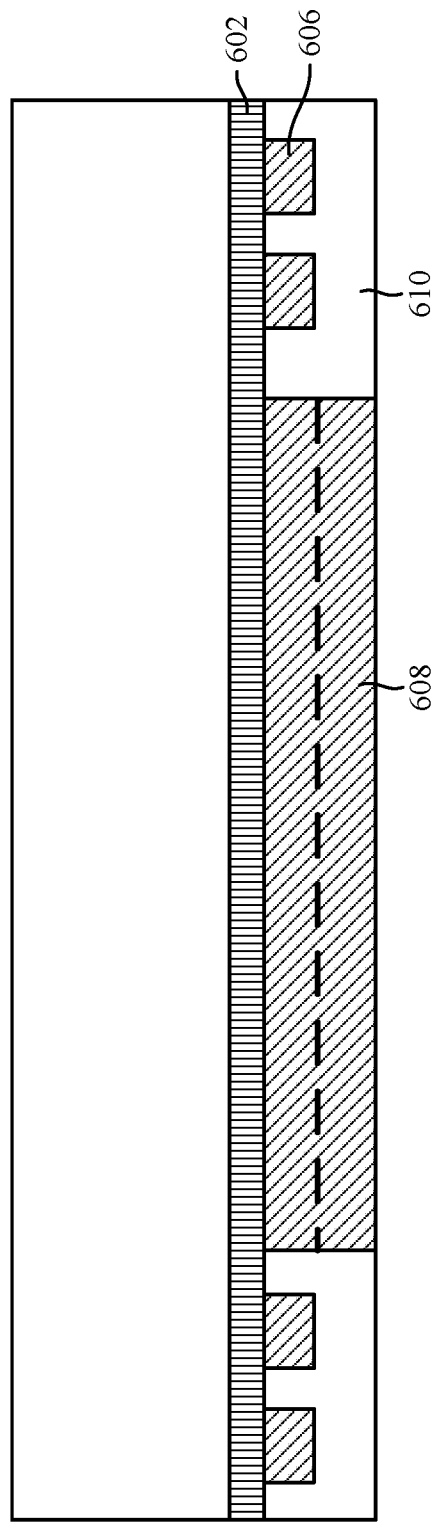
Figure 6F:
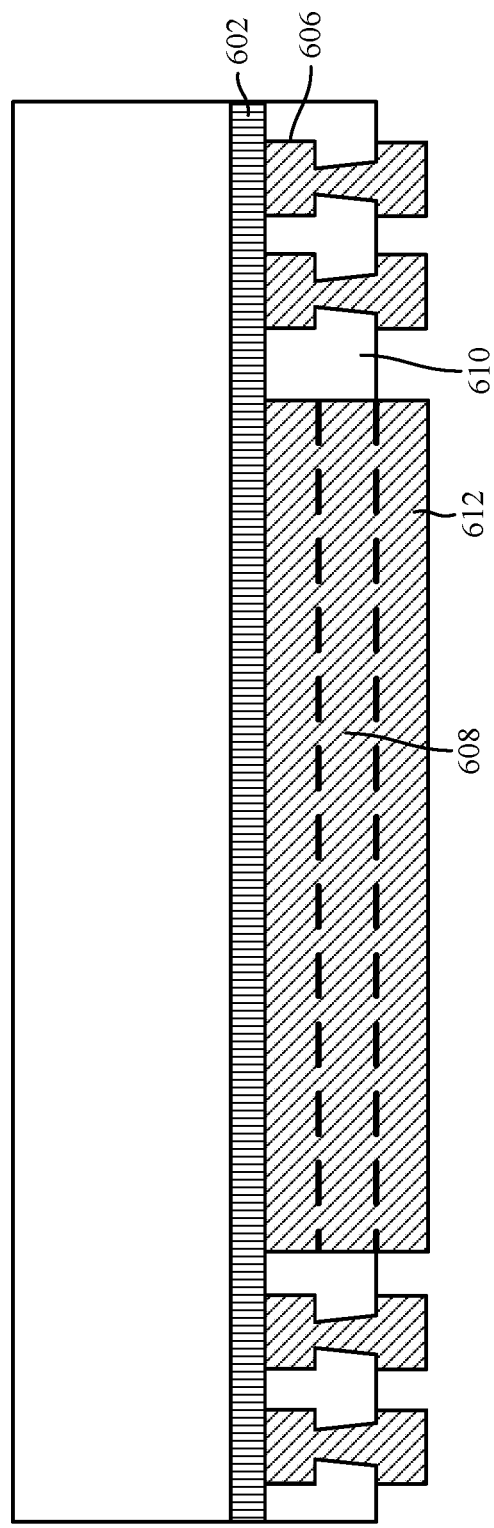

As illustrated in FIG. 6D, a dielectric (or insulation) layer 610 may be formed (e.g., via a pre-impregnated lamination process) over the exposed portions of the chip carrier 602, the metallic layer 606, and the metallic plate 608. As illustrated in FIG. 6E, portions of the dielectric layer 610 and metallic plate 608 may be removed (e.g., via a grinding process). As illustrated in FIG. 6F, a metallic layer 612 may be formed over the dielectric layer 610 and the metallic plate 608, and subsequently patterned. The dielectric layer 610 may include $SiO_2$, for example.

Figure 6G:
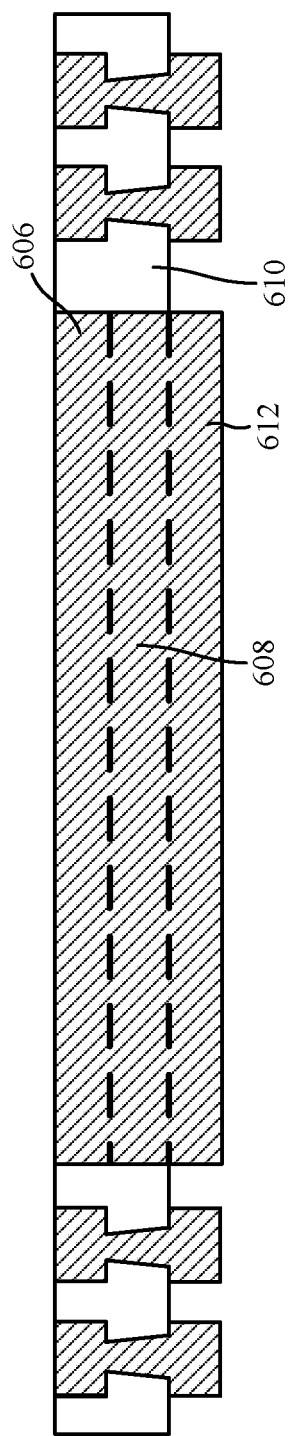
Figure 6H:
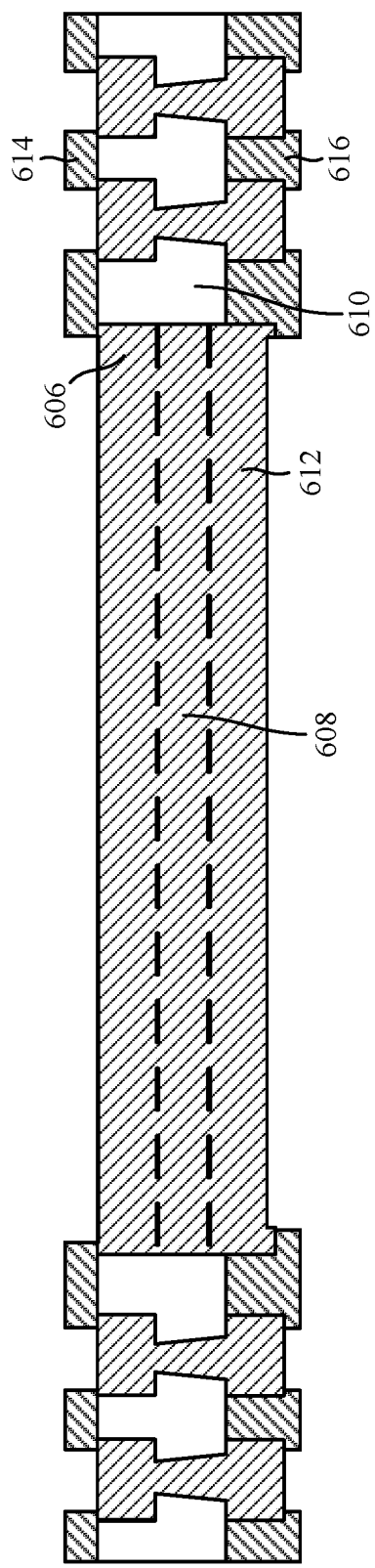

As illustrated in FIG. 6G, the metallic layer 606, metallic plate 608, metallic layer 612, and dielectric layer 610 may be separated from the chip carrier 602. The metallic plate 608, the portion of the metallic layer 606 on which the metallic plate 608 is formed, and the portion of the metallic layer 612 formed on the metallic plate 608 may be used to form metallic plate 240 of interposer 204. As illustrated in FIG. 6H, a photo solder resist layer 614 may be formed on a top surface of the dielectric layer 610 and metallic layer 606, and subsequently patterned, e.g., to form photo solder resist layer 222 of the interposer 204. Similarly, a photo solder resist layer 616 may be formed on a bottom surface of the dielectric layer 610 and metallic layer 612, and subsequently patterned, e.g., to form photo solder resist layer 214 of the interposer 204.

Figure 7:
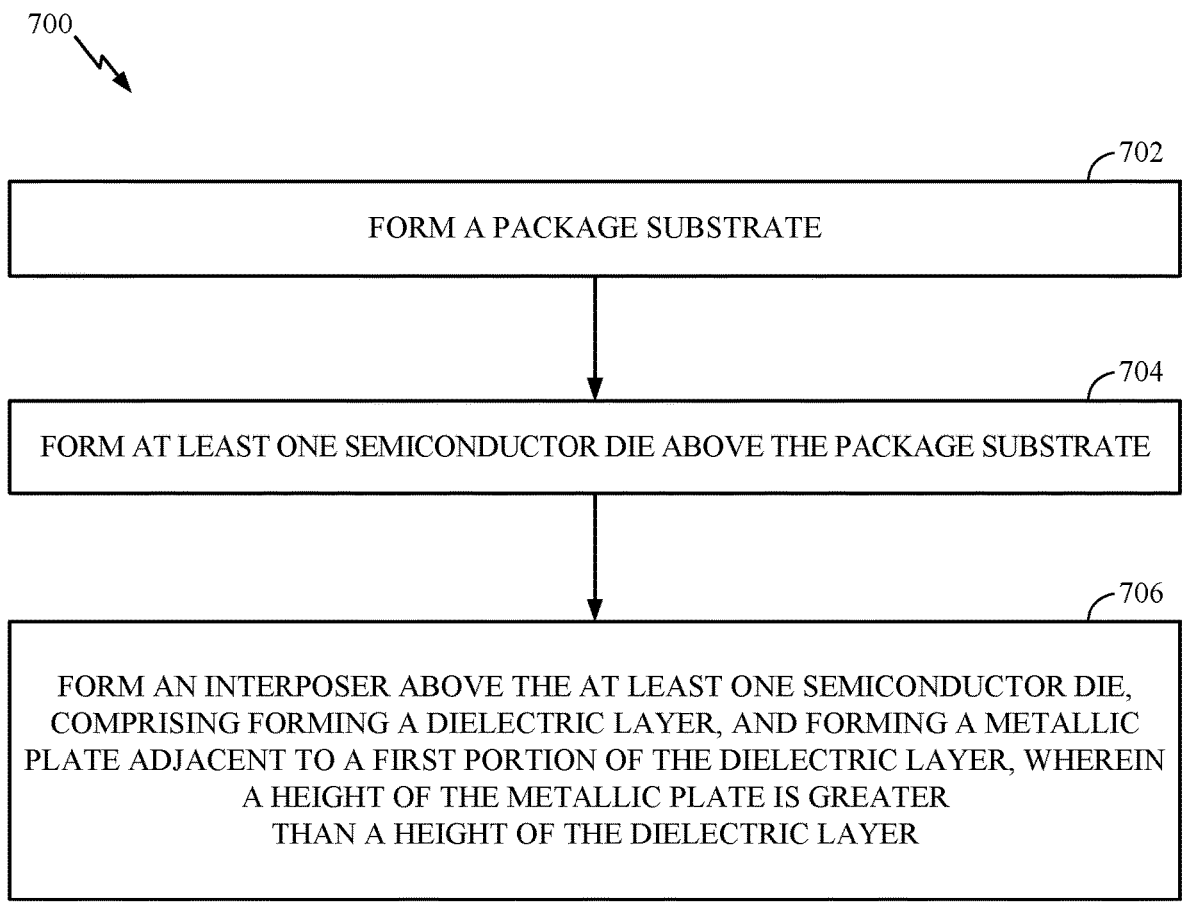
FIG. 7 is a flow diagram illustrating example operations for fabricating an IC package with a high thermal release interposer, in accordance with certain aspects of the present disclosure.

FIG. 7 is a flow diagram of example operations 700 for fabricating a IC package with a high thermal release interposer, in accordance with certain aspects of the present disclosure. The operations 700 may be performed, for example, by a semiconductor processing chamber.

The operations 700 begin, at block 702, by forming a package substrate (e.g., package substrate 102), and at block 704, forming at least one semiconductor die (e.g., IC die(s) 110) above the package substrate. At block 706, an interposer (e.g., interposer 204) is formed above the at least one semiconductor die. The interposer may be formed by forming a dielectric layer (e.g., dielectric layer 218), and forming a metallic plate (e.g., metallic plate 240) adjacent to a first portion (e.g., portion 234 or portion 246) of the dielectric layer. A height of the metallic plate is greater than a height of the dielectric layer. In some aspects, operations 700 may include forming the metallic plate between the first portion (e.g., portion 246) of the dielectric layer and a second portion (e.g., portion 234) of the dielectric layer, e.g., as shown in FIG. 2.

According to certain aspects, operations 700 may further include forming a first metallic layer (e.g., metallic layer 216) below the dielectric layer, and forming a second metallic layer (e.g., metallic layer 220) above the dielectric layer. In this aspect, operations 700 may include forming the metallic plate adjacent to a first portion (e.g., portion 248 or portion 236) of the first metallic layer and a first portion (e.g., portion 244 or portion 232) of the second metallic layer. In some cases, the metallic plate 240 may be disposed between the portions 248 and 244 of the metallic layers 216 and 220, respectively, and the portions 236 and 232 of the metallic layers 216 and 220, respectively, e.g., as shown in FIG. 2. In this aspect, the height of the metallic plate may be approximately equal to a sum of heights of the first metallic layer, the dielectric layer, and the second metallic layer.

According to certain aspects, operations 700 may further include forming a first solder resist layer (e.g., photo solder resist layer 214) below the first metallic layer (e.g., metallic layer 216), and forming a second solder resist layer (e.g., photo solder resist layer 222) above the second metallic layer (e.g., metallic layer 220). In some aspects, operations 700 may include forming the metallic plate adjacent to a first portion (e.g., portion 242 or portion 230) of the second solder resist layer, e.g., as shown in FIG. 2. In some aspects, operations 700 may include forming the metallic plate adjacent to a first portion (e.g., portion 242 or portion 230) of the second solder resist layer and a first portion (e.g., portion 406 or portion 402) of the first solder resist layer, e.g., as shown in FIG. 4. In some cases, e.g., as shown in FIG. 4, the height of the metallic plate may be equal to a sum of heights of the first metallic layer, the first solder resist layer, the dielectric layer, and the second solder resist layer.

According to certain aspects, operations 700 may include forming at least one adhesive layer (e.g., TIM layer 510) above the at least one semiconductor die and below the metallic plate. In some aspects, the metallic plate may overlap at least a portion of the at least one semiconductor die. In some aspects, operations 700 may include forming a first set of metallic (e.g., Cu) core balls (e.g., metallic core balls 108) (or a set of solder balls) above the package substrate and below a first portion (e.g., portion 246) of the dielectric layer, and forming a second set of metallic (e.g., Cu) core balls (e.g., metallic core balls 108) (or a set of solder balls) above the package substrate and below a second portion (e.g., portion 234) of the dielectric layer.

In some aspects, operations 700 may further include forming multiple metallic (e.g., Cu) core balls (e.g., metallic core balls 140) below the package substrate. In some aspects, forming the metallic plate may include at least one of exposing the metallic plate at a bottom surface of the interposer for thermal coupling with the at least one semiconductor die, or exposing the metallic plate at an upper (top) surface of the interposer.

Figure 8:
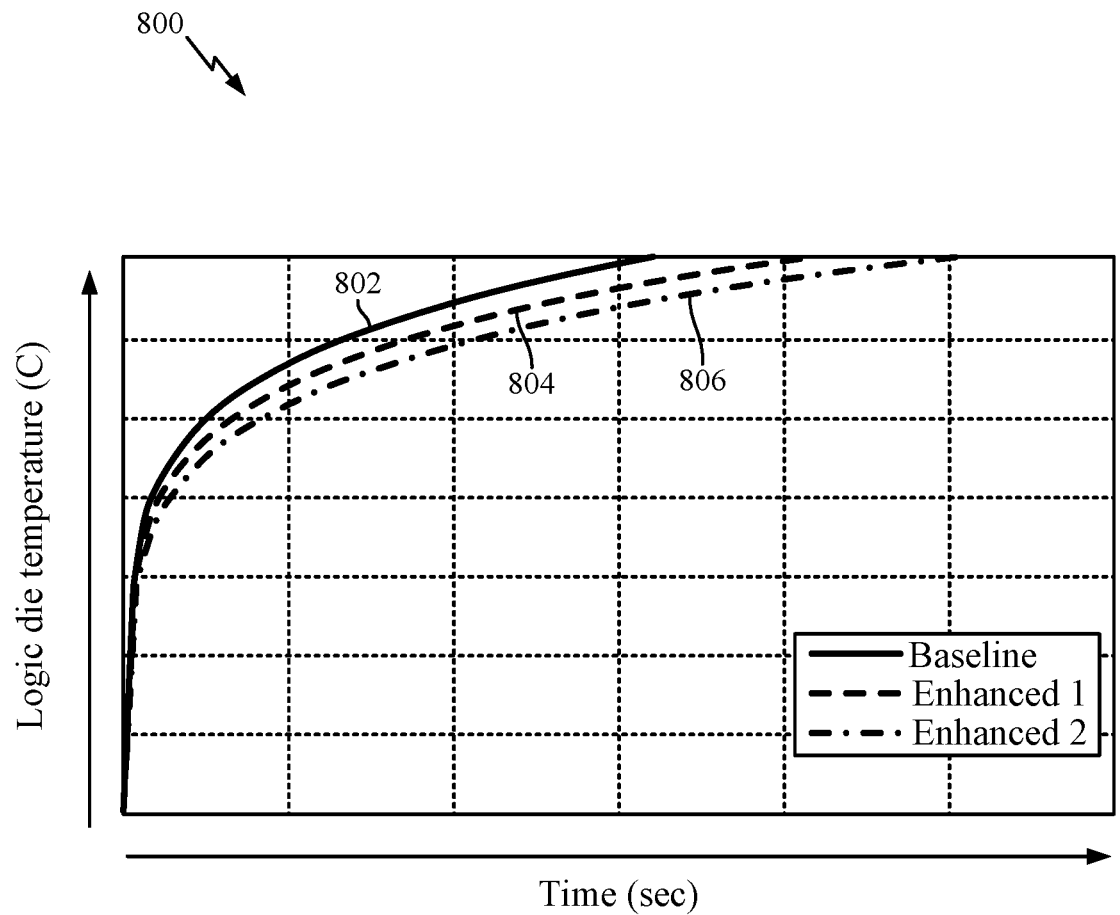
FIG. 8 is an example thermal simulation showing thermal performances of different IC packages, in accordance with certain aspects of the present disclosure.

FIG. 8 is an example thermal simulation 800, which shows the thermal performance of different IC packages (e.g., for a central processing unit (CPU)-intensive process), in accordance with certain aspects of the present disclosure. In thermal simulation 800, curve 802 represents the thermal performance of a "baseline" IC package (e.g., IC package 100) with a conventional interposer, curve 804 represents the thermal performance of an "enhanced 1" IC package (e.g., IC package 200) with an interposer that includes a metallic plate, and curve 806 represents the thermal performance of an "enhanced 2" IC package (e.g., IC package 500) that includes an interposer (e.g., with a metallic plate) and a TIM layer disposed between the interposer and the IC die(s). As shown, as the logic die temperature increases, the "enhanced 1" IC package may extend the transient time-to-throttle (TTT) compared to the "baseline" IC package, and the "enhanced 2" IC package may extend the transient TTT compared to the "baseline" IC package and "enhanced 1" IC package.

Figure 9:
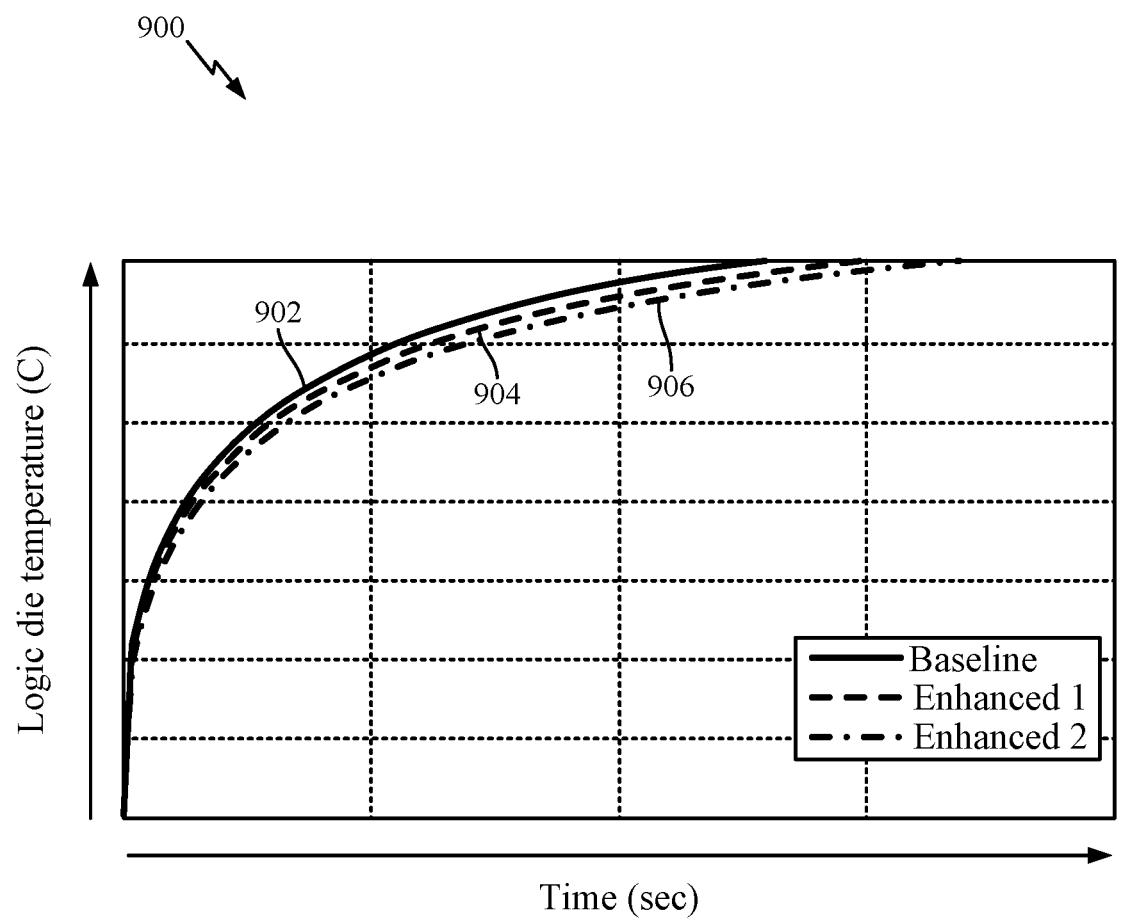
FIG. 9 is another example thermal simulation showing thermal performances of different IC packages, in accordance with certain aspects of the present disclosure.

FIG. 9 is an example thermal simulation 900, which shows the thermal performance of different IC packages (e.g., for a graphics processing unit (GPU)-intensive process), in accordance with certain aspects of the present disclosure. In thermal simulation 900, curve 902 represents the thermal performance of a "baseline" IC package (e.g., IC package 100) with a conventional interposer, curve 904 represents the thermal performance of an "enhanced 1" IC package (e.g., IC package 200) with an interposer that includes a metallic plate, and curve 906 represents the thermal performance of an "enhanced 2" IC package (e.g., IC package 500) that includes an interposer (e.g., with a metallic plate) and a TIM layer disposed between the interposer and the IC die(s). As shown, as the logic die temperature increases, the "enhanced 1" IC package may extend the transient TTT compared to the "baseline" IC package, and the "enhanced 2" IC package may extend the transient TTT compared to the "baseline" IC package and "enhanced 1" IC package.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An integrated circuit package, comprising:
   a package substrate;
   at least one semiconductor die disposed above the package substrate; and
   an interposer disposed above the at least one semiconductor die, the interposer comprising:
      a dielectric layer;
      a first metallic layer disposed below the dielectric layer;
      a second metallic layer disposed above the dielectric layer;
      a first solder resist layer disposed below the first metallic layer;
      a second solder resist layer disposed above the second metallic layer; and
      a metallic plate disposed adjacent to a first portion of the dielectric layer, a first portion of the first solder resist layer, and a first portion of the second solder resist layer, wherein a height of the metallic plate is greater than a height of the dielectric layer.

2. The integrated circuit package of claim 1, wherein the metallic plate is further disposed between the first portion of the dielectric layer and a second portion of the dielectric layer.

3. The integrated circuit package of claim 2, further comprising:
   a first set of metallic core balls disposed above the package substrate and below the first portion of the dielectric layer; and
   a second set of metallic core balls disposed above the package substrate and below the second portion of the dielectric layer.

4. The integrated circuit package of claim 1, wherein the metallic plate is further disposed adjacent to a first portion of the first metallic layer and a first portion of the second metallic layer.

5. The integrated circuit package of claim 4, wherein the height of the metallic plate is greater than a sum of heights of the first metallic layer, the dielectric layer, and the second metallic layer.

6. The integrated circuit package of claim 4, wherein the metallic plate is further disposed between:
   the first portion of the first metallic layer and the first portion of the second metallic layer; and
   a second portion of the first metallic layer and a second portion of the second metallic layer.

7. The integrated circuit package of claim 1, wherein the height of the metallic plate is equal to a sum of heights of the first metallic layer, the first solder resist layer, the dielectric layer, the second metallic layer, and the second solder resist layer.

8. The integrated circuit package of claim 1, wherein the metallic plate is further disposed between the first portion of the second solder resist layer and a second portion of the second solder resist layer.

9. The integrated circuit package of claim 1, wherein the metallic plate is further disposed between:
   the first portion of the first solder resist layer and the first portion of the second solder resist layer; and
   a second portion of the first solder resist layer and a second portion of the second solder resist layer.

10. The integrated circuit package of claim 1, further comprising at least one adhesive layer disposed above the at least one semiconductor die and below the metallic plate.

11. The integrated circuit package of claim 1, wherein the metallic plate overlaps at least a portion of the at least one semiconductor die.

12. The integrated circuit package of claim 1, further comprising a plurality of metallic core balls disposed below the package substrate.

13. The integrated circuit package of claim 1, wherein the metallic plate is exposed at a bottom surface of the interposer for thermal coupling with the at least one semiconductor die.

14. The integrated circuit package of claim 1, wherein the metallic plate is exposed at an upper surface of the interposer.

15. A method for fabricating an integrated circuit package, comprising:
   forming a package substrate;
   forming at least one semiconductor die above the package substrate; and
   forming an interposer above the at least one semiconductor die, comprising:
      forming a dielectric layer;
      forming a first metallic layer below the dielectric layer;
      forming a second metallic layer above the dielectric layer;
      forming a first solder resist layer below the first metallic layer;
      forming a second solder resist layer above the second metallic layer; and
      forming a metallic plate adjacent to a portion of the dielectric layer, a first portion of the first solder resist layer, and a first portion of the second solder resist layer, wherein a height of the metallic plate is greater than a height of the dielectric layer.

16. The method of claim 15, wherein the metallic plate is formed adjacent to a portion of the first metallic layer and a portion of the second metallic layer.

17. The method of claim 15, wherein the height of the metallic plate is greater than a sum of heights of the first metallic layer, the dielectric layer, and the second metallic layer.

18. The method of claim 15, wherein the height of the metallic plate is equal to a sum of heights of the first metallic layer, the first solder resist layer, the dielectric layer, the second metallic layer, and the second solder resist layer.

19. The method of claim 15, wherein the metallic plate is formed between the first portion of the second solder resist layer and a second portion of the second solder resist layer.

20. The method of claim 15, wherein the metallic plate is disposed between:
- the first portion of the first solder resist layer and the first portion of the second solder resist layer; and
- a second portion of the first solder resist layer and a second portion of the second solder resist layer.

* * * * *